UNITED STATES PATENT OFFICE.

THOMAS C. ROCHE, OF BROOKLYN, NEW YORK, ASSIGNOR TO JAMES R. OSGOOD, OF BOSTON, MASSACHUSETTS.

PHOTO-MECHANICAL PRINTING.

SPECIFICATION forming part of Reissued Letters Patent No. 9,608, dated March 15, 1881.

Original No. 218,137, dated August 5, 1879. Application for reissue filed July 17, 1880.

*To all whom it may concern:*

Be it known that I, THOMAS C. ROCHE, of the city of Brooklyn, county of Kings, and State of New York, have invented certain Improvements in the Art of Photo-Mechanical Printing, of which the following is a specification.

My invention consists, essentially, in the methods, hereinafter mentioned and described, of constructing and preparing the gelatine film employed for the reception of the photographic image or impression, together with a supporting-plate having special features adapted to hold and retain the film firmly in place, and which is eventually used to print from in fatty inks, after the manner of lithography.

The first requisite to the greatest attainable perfection in this art, after a clear and strong negative has been obtained, is a gelatine type or film having those chemical and structural characteristics which will enable it to receive and retain in the most perfect manner the actinic image conveyed to it through the negative, with all the delicate gradations of light and shade found in the natural object, together with that firmness, smoothness of surface, and adhesiveness to the plate or tablet on which it is placed that will enable it to endure, without injury or disturbance, the application of ink of any desired consistency or stiffness, and the pressure necessary to secure a complete transfer of the picture in the printing.

The main object of my improvement, therefore, is to secure with uniformity and certainty all the conditions essential to success; and to this end I have discovered that the requisite hardness, firmness, fineness of structure, and smoothness of surface may be secured in the gelatine film forming the photographically-impressed printing-surface, and also the necessary degree of toughness and elasticity, by the application during its preparation of alcohol previously heated to a degree of temperature nearly coincident with that of the gelatine solution, either before or after the application of the sensitizing agent employed. I have also discovered that plates of certain metals, such as copper, when cut or roughened by the process known as the "sand-blast," or by the more common methods of grinding or roughening by mechanical means with emery, or sand and water, or chemically by means of an acid-bath, meet more adequately the conditions necessary to the procurement and production of the best effects in photo-mechanical printing. This result is due in a measure to the fact that the bichromate contained in the gelatine solution with which the metal plate is coated is acted on by the metal surface of the supporting-plate, whereby chromic acid is formed. The chromic acid thus formed acts on the gelatine next to the plate and renders it insoluble, while the upper portion of the gelatine is not affected. The insoluble layer of gelatine next to the supporting-plate being non-absorbent thus attaches the printing film to the supporting plate. It is important, however, that the surface be sufficiently roughened and abraded in order to set up the necessary amount of chemical action, a smooth highly-polished surface being antagonistic to the formation of a sufficient quantity of chromic acid to produce the practical result aimed at. The sand-blast offers the most convenient method for the purpose.

I will now proceed to describe more particularly and in detail my improved method of preparing the gelatine film previous to its being flowed upon its supporting-plate.

I first take fine gelatine—say about three hundred and sixty grains—and immerse it in pure cold water until it has absorbed or taken up all of the liquid it will. I then pour off the surplus water and dissolve the gelatine by the application of heat, a sand or water bath being the preferable way. I then dissolve, say, one dram of bichromate of ammonia or potash in about one ounce of water, and add this to the gelatine solution keeping the same warm, preferably at a temperature of not less than 90° Fahrenheit nor higher than 150° Fahrenheit. I then take about six ounces of alcohol and dilute it with from one and a half to two ounces of pure water. Now, were the alcohol, diluted or not, added in its cold state to the gelatine solution it would coagulate the same, the coagulum presenting itself as a curdlike or ropy substance separated from the more fluid portion of the solution, thereby rendering it entirely unfit for its intended purpose. To avoid this coagulation, therefore, I heat the alcohol previous to adding it to and mixing it with the gelatine solution, the relative temperatures being about 110° Fahrenheit for the alcohol and 130° Fahrenheit for the gelatine at the time of mixing the same together. If undiluted alcohol should be used it would produce partial coagulation, even at 145° Fahrenheit, with the gelatine solution heated to 180° Fahrenheit; but if heated only to its boiling point—namely, 174° Fahrenheit—then coagulation of the gelatine is prevented. Still this method of using the alcohol is objectionable, both because of the loss of the spirit by rapid evaporation at that temperature, and because the gelatine solution to which it might be added would dry too rapidly and thereby injure the structural condition of the film. The better method, accordingly, is to dilute the alcohol in the proportion of from one-third to one-fourth water, heating the solutions separately up to about the degrees of temperature first stated and then adding them together in their heated condition. The proportions of the gelatine and bichromate or alcohol may be somewhat varied without material change, but the proportion of the diluted alcohol should not, preferably, be reduced below one-fourth, by weight, to about three-fourths of the gelatine and bichromate combined. The mixture should be well stirred as the heated alcohol is added, and then the whole filtered, for which purpose a flannel cloth laid in a funnel may be used, and the filtering done while the mixture is being poured into the bottle in which it is to be kept for use. Preferably I use a funnel that extends to the bottom of the bottle, to avoid the formation of air-bubbles in the mixture, which, when once formed, are somewhat difficult to suppress, it being important that they shall not appear on the plate when the mixture is flowed onto it. I prefer, also, not to allow the temperature of the solution to fall below, say, 130° Fahrenheit before it is applied to the plate; and to this end it may be kept in a sand or water bath of the proper degree of heat. A gelatine solution thus made, when flowed onto a plate, will form a fine, hard, and tough film, tenaciously adherent to the plate, and presenting a fine, smooth, and glossy surface for the reception of the photographic impression. This solution is applied in a heated state by flowing the same over a plate having a roughened surface of the character before described, which is also preferably heated to about the same temperature as the solution, so as to cover its surface thoroughly and allow the material of the film to enter completely into all the pits, excavations, and under-cuts of the plate, any surplus being then drained off. The plate, with the film on it, is then dried in a heated oven or by other suitable means, the heat applied to dry it preferably not to be greater than 120°, nor less than 100° Fahrenheit. When dry, unless the plate has been dried on a leveling-stand, and thereby a film of sufficient thickness has been formed, a second coat of the gelatine mixture is preferably applied, drawing off the surplus from the opposite edge or corner from that from which the first flowing was drained. This second coat is dried like the first, the operation of drying in the oven being continued until vapor ceases to rise from the film. The sensitized solution should, of course, be protected from actinic effect, and the operation of coating the plate be carried on in the absence of actinic light.

It may be stated, incidentally, that the sensitizing agent may be applied to the gelatine solution either before or after the application of the heated alcohol, and may even be applied to the plate after the gelatine film has been formed upon it with equal effect and without departing from the spirit of my invention.

The plates, prepared as hereinbefore described, like the gelatine solution when sensitized, must be kept from the effect of actinic light, but may be exposed at any time within ten or twelve days from their preparation with a negative for the reception of the photographic image. After the plate has been exposed it is freed from all bichromate not acted on by the light, which may be done by washing in cold running water for a short time, and then, as a matter of preference, allowing it to dry, after which it is ready for the printing-press.

Now, I am aware that alcohol in a cold state has been mixed with gelatine to form a varnish or preserving coating for pictures and for other purposes. I am also aware that alcohol in such state has been mixed and used in very small quantity with a sensitized gelatine solution, together with a hardening element, such as tannin and other ingredients, the whole compounded and intermixed, by the application of heat, to produce a photographic-printing film from which to print in fatty inks; but I am not aware of alcohol being used, previous to my invention, heated previously to its admixture with such solution, with or without the addition of a bichromate or other sensitizing agent, nearly up to the same degree of temperature, for the two-fold purpose of preventing the coagulation of the gelatine and also hardening the same, thus taking the place of and dispensing with the ingredients usually employed, and especially alum, or the well-known effect produced by the exposure of the film to light for the purpose of enabling it to withstand the pressure of printing.

Having thus described my invention, what I claim as new, and for which I desire Letters Patent, is—

1. The described process of producing and preparing gelatine films for use in the production of plates for photographic printing in fatty inks, which consists, essentially, in first immersing the gelatine in cold water and allowing it to absorb as much of the same as it will, then dissolving the gelatine by heat in the usual way, then taking alcohol diluted with about one-fourth to one-third its volume of water, and heating it within a few degrees of the temperature of the gelatine solution, and finally uniting and mixing the alcoholic and gelatine solutions together while in their relatively-heated state, substantially as and for the purpose specified.

2. The described process of producing and preparing gelatine films for use in the production of plates for photographic printing in fatty inks, which consists, essentially, in first immersing the gelatine in cold water and allowing it to absorb as much of the same as it will, then dissolving the gelatine by heat in the usual way, then adding to the gelatine solution while hot a solution of bichromate of ammonia or potash or other suitable sensitizing agent, then taking alcohol diluted with about one-fourth to one-third its volume of water, and heating it to within a few degrees of the temperature of the sensitized gelatine solution, and finally uniting and mixing the alcoholic and sensitized gelatine solutions together in their relatively-heated state, all substantially as and for the purpose set forth.

3. In combination with a gelatine film, compounded and prepared substantially in the manner above described and claimed, a supporting plate or tablet of metal, glass, or other hard substance susceptible of abrasion, having a sand-blast-roughened surface for holding the film firmly and with such tenacity as to permit of the use of ink of any desired consistency in printing, the whole forming an improved photocollotype, or photographically-impressed and prepared plate for printing from in fatty inks, after the manner of lithography, substantially as and for the purpose specified.

4. A photo-mechanical printing-plate composed of a supporting-tablet of copper or other suitable metal, roughened as described, and a gelatine film containing a bichromate, or its equivalent, the gelatine film being rendered insoluble next to the plate and caused to adhere thereto by the formation of chromic acid, substantially as described.

Witness my hand this 22d day of June, A. D. 1880.

THOMAS C. ROCHE.

In presence of—

PHILLIP ABBOTT,

BERN. T. VETTERLEIN.